(12) United States Patent
Marcacci

(10) Patent No.: US 12,074,039 B2
(45) Date of Patent: Aug. 27, 2024

(54) CHILLER MAKE-BREAK CONNECTOR FOR SUBSTRATE PROCESSING SYSTEMS

(71) Applicant: LAM RESEARCH CORPORATION, Fremont, CA (US)

(72) Inventor: Alexander Charles Marcacci, Union City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 182 days.

(21) Appl. No.: 17/908,060

(22) PCT Filed: Feb. 25, 2021

(86) PCT No.: PCT/US2021/019566
§ 371 (c)(1),
(2) Date: Aug. 30, 2022

(87) PCT Pub. No.: WO2021/178192
PCT Pub. Date: Sep. 10, 2021

(65) Prior Publication Data
US 2023/0116577 A1 Apr. 13, 2023

Related U.S. Application Data

(60) Provisional application No. 62/984,081, filed on Mar. 2, 2020.

(51) Int. Cl.
*H01L 21/67* (2006.01)
*H01L 21/677* (2006.01)

(52) U.S. Cl.
CPC .. *H01L 21/67017* (2013.01); *H01L 21/67772* (2013.01); *H01L 21/67775* (2013.01)

(58) Field of Classification Search
CPC ......... H01L 21/67017; H01L 21/67772; H01L 21/67775; H01L 21/6719; H01L 21/68714;

(Continued)

(56) References Cited

U.S. PATENT DOCUMENTS 6,658,762 B2 12/2003 Chang et al.
2004/0187787 A1* 9/2004 Dawson ............ H01L 21/67248
118/728

(Continued)

FOREIGN PATENT DOCUMENTS

JP 2012069825 A 4/2012
JP 2018093087 A 6/2018

(Continued)

OTHER PUBLICATIONS

International Search Report and Written Opinion of the ISA issued in PCT/US2021/019566, mailed Jun. 14, 2021; ISA/KR.

*Primary Examiner* — Glenn F Myers

(57) ABSTRACT

A substrate processing system includes a hinge assembly configured to allow a substrate support and an RF bias assembly to slide, from a docked position to an undocked position, relative to other components of a processing chamber. A make-break connector is configured to supply fluid to at least one of the substrate support and the RF bias assembly. The make-break connector includes a first portion including a first fluid passage connected to a first conduit. A second portion includes a second fluid passage connected to a second conduit. The first fluid passage in the first portion fluidly communicates with the second fluid passage in the second portion. The first portion is configured to slide with the substrate support and the RF bias assembly relative to the second portion and the other portions of the processing chamber. The first portion is located inwardly relative to the second portion.

11 Claims, 10 Drawing Sheets

(58) Field of Classification Search
CPC .......... H01L 21/67173; H01J 37/32733; H01J 37/32715
See application file for complete search history.

(56) References Cited

U.S. PATENT DOCUMENTS

| | | | |
|---|---|---|---|
| 2010/0009533 A1* | 1/2010 | Shaviv | H01L 21/68714 438/653 |
| 2012/0076619 A1 | 3/2012 | Takahashi et al. | |
| 2023/0097597 A1* | 3/2023 | Bentz | H01L 21/6719 414/222.01 |

FOREIGN PATENT DOCUMENTS

| | | | |
|---|---|---|---|
| KR | 101152235 B1 | 6/2012 | |
| WO | WO-2006055236 A2 | 5/2006 | |

* cited by examiner

CHILLER MAKE-BREAK CONNECTOR FOR SUBSTRATE PROCESSING SYSTEMS

CROSS-REFERENCE TO RELATED APPLICATIONS

This application is a U.S. National Phase Application under 35 U.S.C. 371 of International Application No. PCT/US2021/019566, filed on Feb. 25, 2021, which claims the benefit of U.S. Provisional Application No. 62/984,081, filed on Mar. 2, 2020. The entire disclosures of the applications referenced above are incorporated herein by reference.

FIELD

The present disclosure relates to substrate processing systems and more particularly to a system for connecting a chiller to a processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

SUMMARY

A substrate processing system includes a hinge assembly configured to allow a substrate support and an RF bias assembly of a processing chamber to slide, from a docked position to an undocked position, relative to other components of the processing chamber. A make-break connector is configured to supply fluid to at least one of the substrate support and the RF bias assembly. The make-break connector includes a first portion including a first fluid passage connected to a first conduit. A second portion includes a second fluid passage connected to a second conduit. The first fluid passage in the first portion fluidly communicates with the second fluid passage in the second portion. A fastener removably connects the first portion to the second portion. The first portion is configured to slide with the substrate support and the RF bias assembly relative to the second portion and the other portions of the processing chamber. The first portion is located inwardly from the second portion relative to a direction of sliding from the docked position to the undocked position.

In other features, the first portion is connected to the second portion when the make-break connector is in the docked position. The first portion is disconnected from the second portion when the make-break connector is in the undocked position. The hinge assembly is configured to allow the substrate support and the RF bias assembly to slide from the docked position to the undocked position and then pivot to a predetermined angle greater than 90°.

In other features, the make-break connector is arranged inside an enclosure.

The enclosure is connected to a gas source and is purged during operation. The gas source is molecular nitrogen or clean dry air.

In other features, the first portion includes a third fluid passage connected to a third conduit. The second portion includes a fourth fluid passage connected to a fourth conduit. The third fluid passage in the first portion fluidly communicates with the fourth fluid passage in the second portion.

A tool includes an equipment front end module (EFEM), a substrate transfer module, a load lock arranged between the EFEM and the substrate transfer module and 2N substrate processing systems of claim 1, where N is an integer from 1 to 5. Half of the 2N substrate processing systems are arranged on one side of the substrate transfer module and the other half of the 2N substrate processing systems are arranged on an opposite side of the substrate transfer module.

In other features, the first portion of the make-break connector includes a plurality of bores. The second portion of the make-break connector includes a plurality of alignment pins that mate with the plurality of bores, respectively, when the first portion is connected to the second portion.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

A semiconductor fabrication (fab) room may include multiple tools each including multiple substrate processing stations (hereinafter referred to as "stations"). Each of the stations can be configured to perform a conductor etch process, a dielectric etch process or other substrate treatment. Space within the fab room is limited and thus the amount of space available to access each of the tools to perform service and/or maintenance on a station is limited. The stations of the tools may be arranged in a star-shaped pattern or a linear pattern.

When in the star-shaped pattern, the stations are disposed around a centrally located substrate transfer module including a robot. The robot moves substrates from a load lock chamber to each of the substrate processing stations and back to the load lock. Although this arrangement of stations provides some access space between stations, the density of stations is less than the density when arranged in the linear pattern.

In the linear pattern, the stations are arranged side-by-side and form two rows of stations. The rows are located on each side of the substrate transfer module, which may operate at atmosphere or vacuum. Although the linear-shaped arrangement allows for more stations to be disposed within a dedicated footprint, the linear-shaped arrangement provides restricted access to sides of the stations.

To improve serviceability, the processing stations may include a slide and pivot assembly to allow a lower portion of the processing chamber (including a front or aisle-facing wall of the processing chamber, the substrate support and the RF bias assembly) to slide out and then pivot into an aisle between adjacent tools. In some examples, the substrate support includes a baseplate with coolant channels that flow fluid to control a temperature of the substrate support and substrates arranged thereon. A top plate assembly can be removed for maintenance, service or replacement. The rest of the processing chamber remains in the same position.

Prior to moving the slide and pivot assembly to a service position, connections to the substrate support and RF bias assembly need to be disconnected. In some examples, the substrate support and/or RF bias assembly may be cooled by fluid. Therefore, fluid connections need to be disconnected prior to moving the slide and pivot assembly to the service position. In some examples, a combination of hard conduit and flexible conduit is used. Some fluid delivery components remain in place with the rest of the processing chamber while other fluid delivery components move with the slide and pivot assembly. As can be appreciated, it is difficult to provide a reliable make-break fluid connection in a relatively confined space below the bias assembly.

Figure 1:
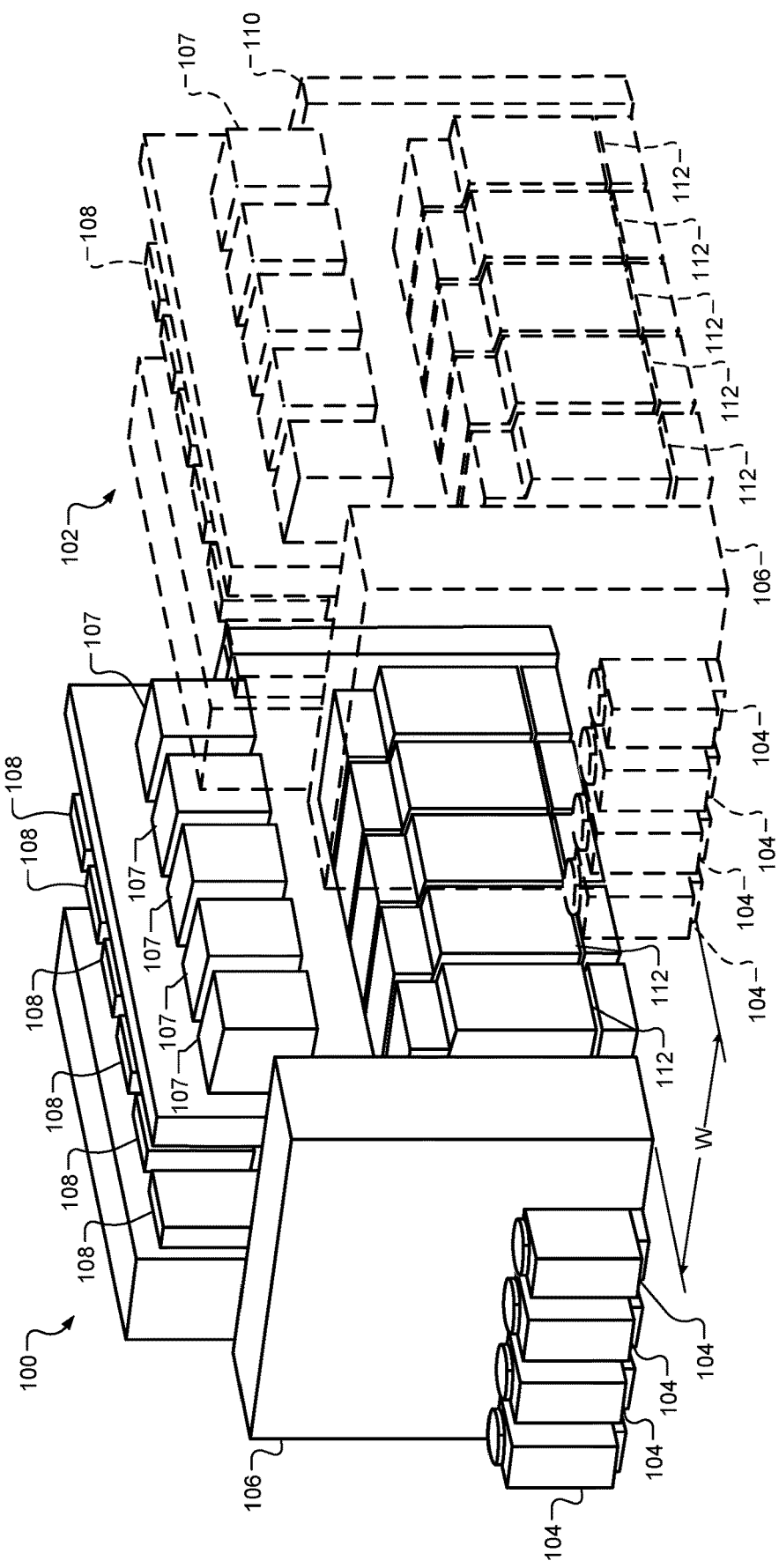
FIG. 1 is a perspective view of portions of two tools including example slide and pivot assemblies.
Figure 2:
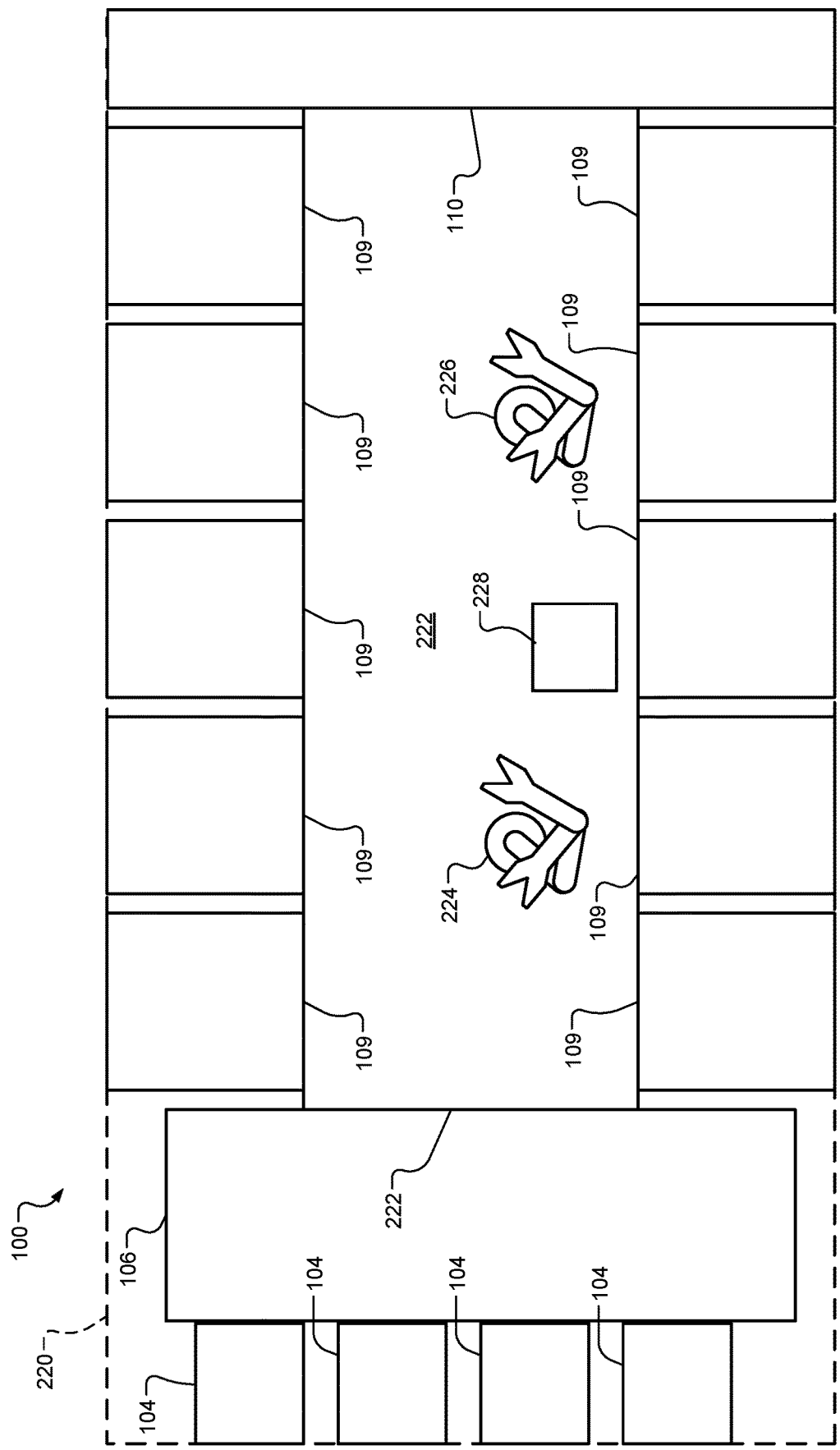
FIG. 2 is a top view of a portion of one of the tools of FIG. 1.

FIGS. 1 and 2 show portions of two tools 100, 102 (one in solid lines at 100 and the other in dashed lines at 102) disposed side-by-side in a fab room. Each of tools includes two rows of stations (one row is shown for each of the tools). The stations are located adjacent to a substrate transfer module (not depicted in FIG. 1 for clarity). There is limited space between the tools 100, 102. A width of an aisle between the tools 100, 102 is shown as W. The width W provides a minimal amount of space between the tools 100, 102 to open processing chambers of the stations and obtain access to process modules and interiors of corresponding processing chambers.

The examples set forth herein include slide and pivot assemblies to be pulled out and pivoted away from corresponding processing chambers and to allow service or maintenance to be performed in the aisle. The slide and pivot assemblies are configured to repeatedly move from a fully docked state to a fully undocked state and to the same fully docked locations. As an example, the slide and pivot assemblies are configured to return the process module bias assemblies to locations within ±25 micrometers (μm, referred to as microns) of the fully docked state. The slide and pivot assemblies are configured to handle and compensate for the heavy loads of the process module bias assemblies. An example overall weight of a process module bias assembly and corresponding slide and pivot assembly is around 300 kilograms (kg).

The tools 100, 102 include: front opening unified pods (FOUPs) 104; an equipment front end module (EFEM) and load lock 106; stations with radio frequency generators 107 and gas boxes 108; and a power lock out and tag out panel 110. The stations further include process module bias assemblies 112, which include respective slide and pivot assemblies (shown in FIG. 4).

Each of the stations alone or in combination may be referred to as a substrate processing system. Each of the stations may be used to etch substrates using, for example, radio frequency (RF) plasma. Each station includes a processing chamber, such as an inductively coupled plasma (ICP) chamber or a conductively coupled plasma (CCP) chamber. The stations may, for example, perform conductive etch or dielectric etch processes or other substrate treatment.

FIG. 2 shows a plan view of the tool 100. The tool 100 includes the FOUPs 104, the EFEM and load lock 106, the stations 109, and the power lock out and tag out panel 110. The tool has an overall footprint 220. The tool further includes a substrate transfer module 222 for transferring substrates to and from the stations 109. The substrate transfer module 222 may include robots 224, 226 and a buffer 228 for temporary storage of substrates. The robots 224, 226 transfer substrates to and from the stations 109 and the buffer 228. In some examples, the substrate transfer module 222 operates at vacuum or atmosphere.

Figure 3:
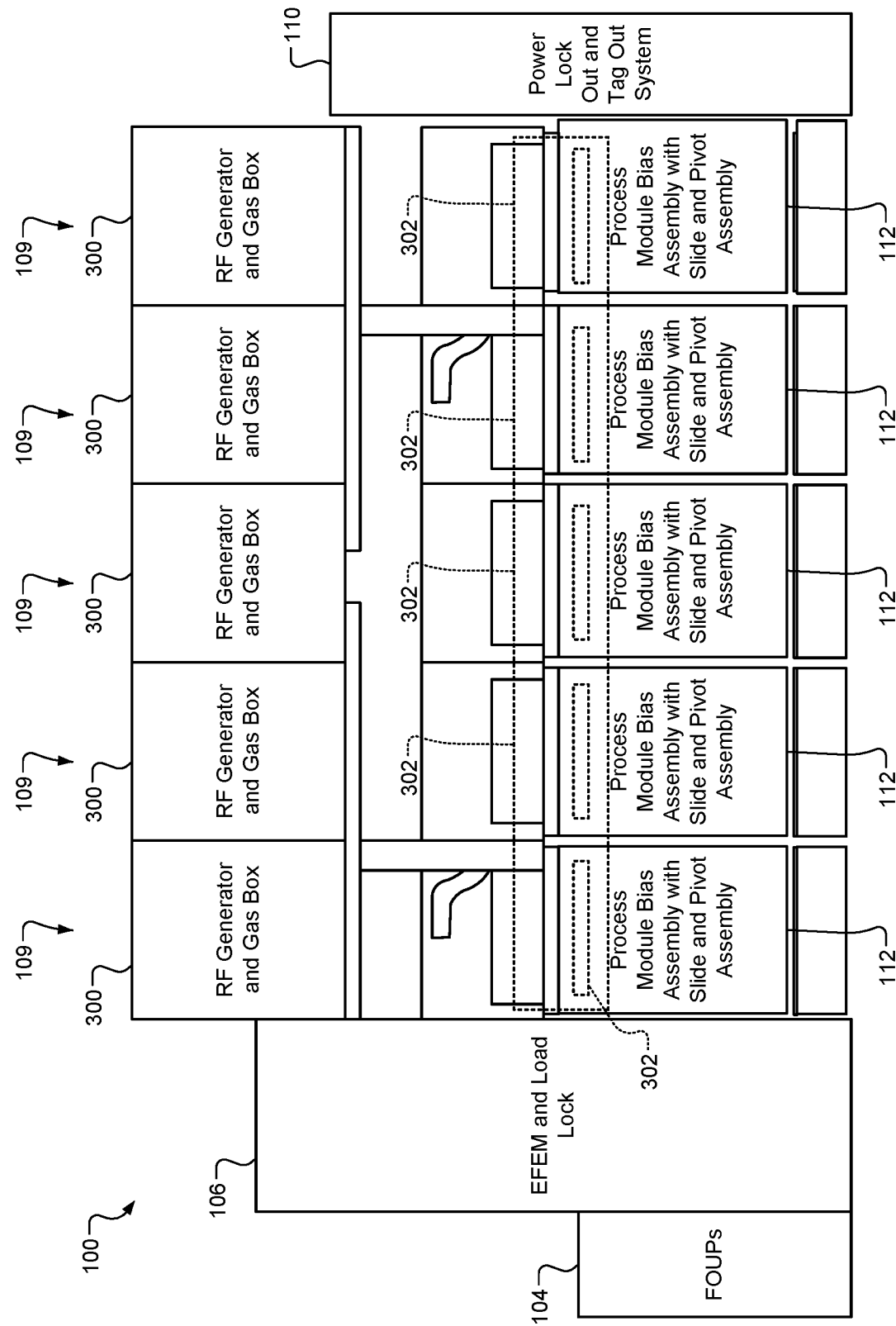
FIG. 3 is a side view of a portion of one of the tools of FIG. 1.

FIG. 3 shows is a side view of the tool 100. The tool 100 includes the FOUPs 104, the EFEM and load lock 106, the stations 109, and the power lock out and tag out system 110. The stations include the RF generators and gas boxes (collectively referred designated 300) and the process module bias assemblies with slide and pivot assemblies 112. The RF generators may provide RF power to electrodes in substrate supports of the stations. The gas boxes supply gases to processing chambers of the stations. The substrate transfer module 222 is also shown.

Substrates scheduled to be loaded and processed are stored in the FOUP 104. The substrates are transferred by the robots 224, 226 from the FOUP 104 to the stations 109 via the EFEM and load lock 106 via respective loading ports 302. In some examples, the RF generators and gas boxes 300 are arranged above the stations 109 and supply RF power and process gases to process modules of the stations 109.

Figure 4B:
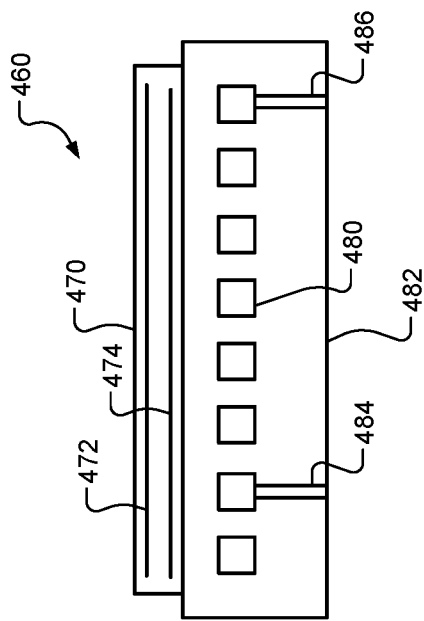
FIG. 4B is a simplified cross-section of an example of a substrate support.
Figure 4A:
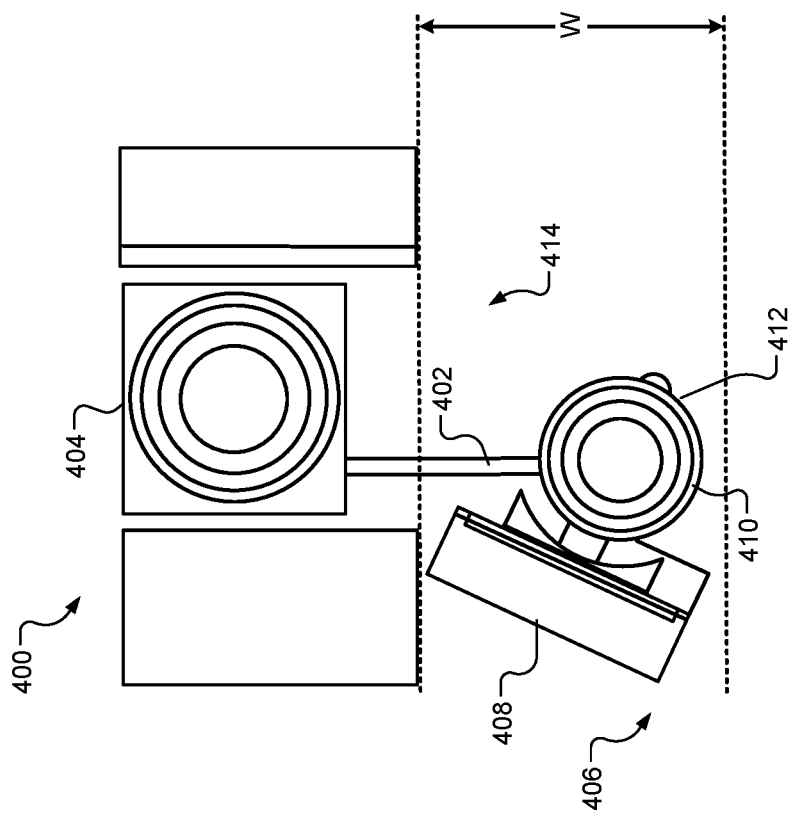
FIG. 4A is a top view of an example of a substrate processing station including a slide and pivot assembly.

FIG. 4A shows a substrate processing station 400 including a slide and pivot assembly 402. The slide and pivot assembly 402 allows a process module bias assembly 406 to slide and pivot relative to remaining components of a processing chamber 404. The slide and pivot assembly 402 allows the process module bias assembly 406 to be pulled out away from the processing chamber 404 and pivoted up to a predetermined angle relative to a front face of the processing chamber 404. The process module bias assembly 406 includes a housing 408, a portion 410 of a process module including a process bias bowl 412. The process module bias assembly 406 may include, in addition to the process bias bowl 412, an electrostatic chuck and/or other substrate support, and a top plate assembly as shown in FIG. 4B.

The example width W of an aisle between the station 400 and an opposing station is shown to illustrate that the process module bias assembly 406 is able to slide out and pivot within the aisle. This provides an open space 414 on a right side of the slide and pivot assembly 402 for a technician to access the process bias bowl 412 and an interior of the processing chamber 404 for service and maintenance purposes including wet cleaning. The process bias bowl 412 and an interior of the processing chamber 404 are accessed from a right side of the process module bias assembly 406 without interference. For example, no slides, rails and/or other components are located in the open space 414 and therefore they do not interfere with a technician accessing the interior of the processing chamber. Although the process module bias assembly 406 is shown pivoting to the left, the slide and pivot assembly may be configured and mounted on the right side of the processing chamber such that the process module and bias assembly pull out and pivot to the right relative to the processing chamber.

FIG. 4B shows a substrate support 460 including a heating layer 470 including electrostatic electrodes 472 and/or RF bias electrodes 474. The heating layer 470 may be made of ceramic or other material and is bonded by a bonding layer to a baseplate 482. The baseplate 482 is typically made of aluminum and includes coolant channels 480 and fluid passages 484 and 486 to supply coolant to and receive coolant from the baseplate 482. The coolant helps to control a temperature of the substrate support and the substrate during processing.

Figure 5:
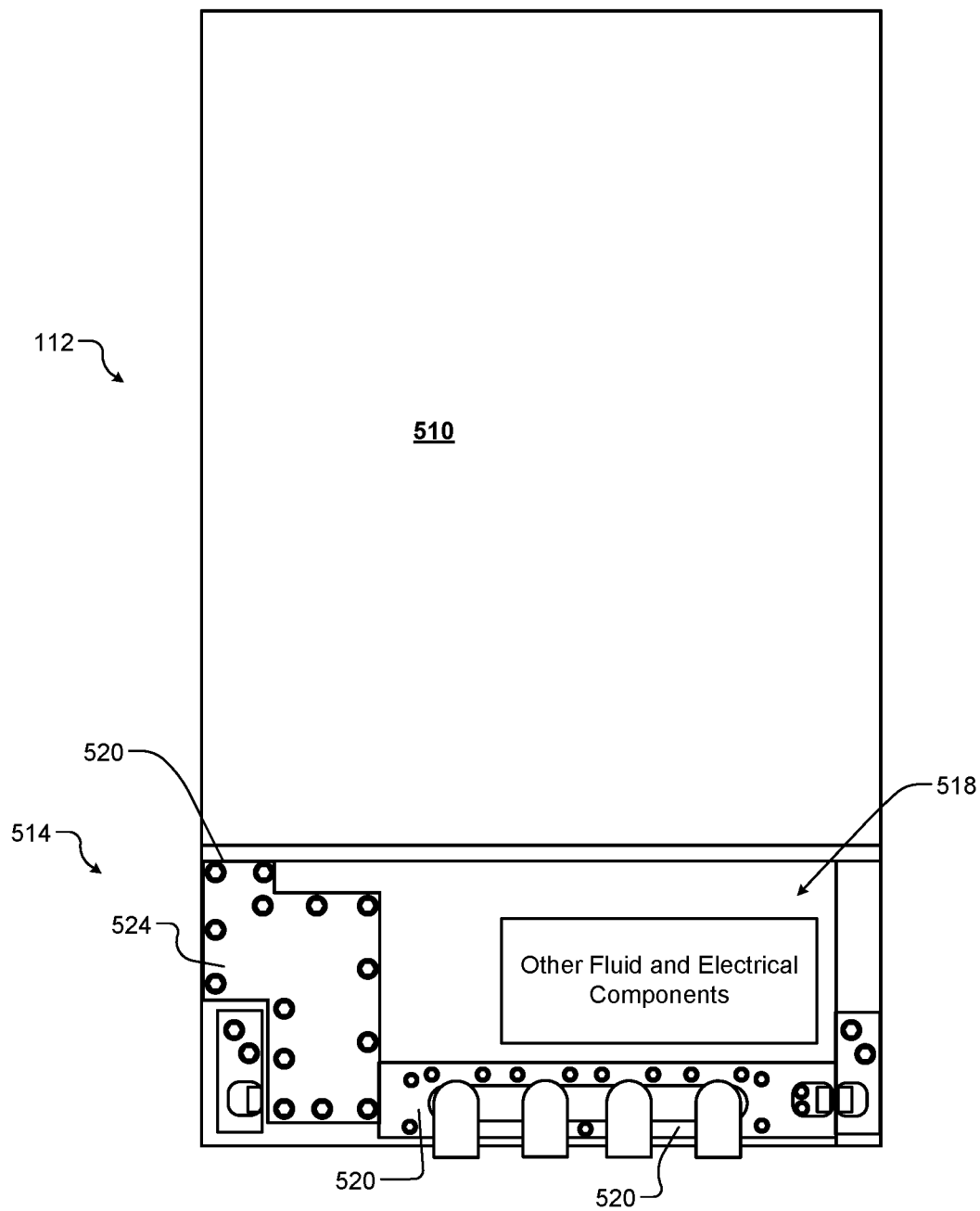
FIG. 5 is a side view of an example of one of the processing stations including an enclosure for a make-break fluid connector in accordance with the present disclosure.

Referring now to FIG. 5, one of the stations is shown from the aisle facing inward. The station includes an upper portion 510 and a lower portion 514. The upper portion 510 includes the process module bias assembly and the substrate support with the slide and pivot assembly 112. The slide and pivot assembly 112 of the upper portion 510 allows the process module to slide outwardly towards the aisle and then pivot to allow access for cleaning, maintenance or other service. In some examples, the slide and pivot assembly of the upper portion 510 pivots outwardly over 90° to allow greater access to the processing chamber. The lower portion 514 remains in the same position and includes an enclosure 520 with a removable cover 524. Other components 518 of the processing module (such as other fluid and/or electrical components and/or enclosures) are arranged between the enclosure of the lower portion 514 and a lower edge of the upper portion 510. In some examples, walls of the enclosure and/or conduits within or outside of the enclosure can be insulated to prevent condensation.

As will be described further below, an inner portion of a make-break connector (see FIG. 7) housed in the enclosure 520 slides outwardly into the aisle with the slide and pivot assembly 112. An outer portion of the make-break fluid connector is pulled outwardly and downwardly prior to sliding or pivoting to allow the inner portion to move unobstructed. Using this arrangement (with the second portion located outwardly relative to the first portion) allows easier alignment and connection of the second portion to the first portion (as compared to the second portion being located inwardly of the first portion). Furthermore, partial use of flexible lines avoids the stacking up of tolerances that otherwise occurs with fluid delivery using all hard lines.

Figure 6:
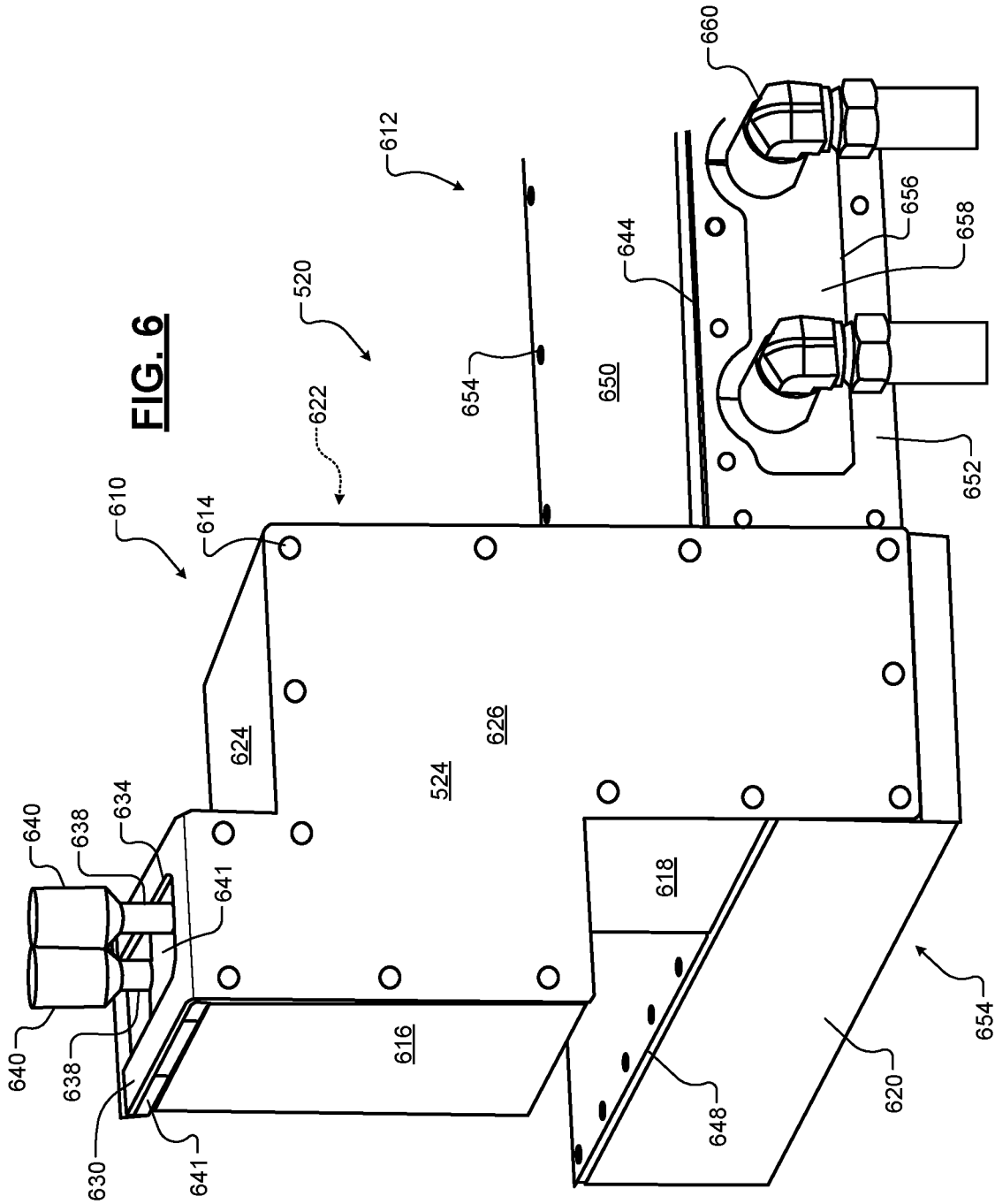
FIG. 6 is a perspective view of an example of the enclosure for the make-break connector for chilled fluid delivered to the processing station in accordance with the present disclosure.

Referring now to FIG. 6, the enclosure 520 for a make-break connector for chilled fluid delivered to the station is shown in further detail. The enclosure 520 includes a vertical housing portion 610 and a horizontal housing portion 612 that is connected to the vertical housing portion 610. The vertical housing portion 610 and the horizontal housing portion 612 of the enclosure 520 define an inner volume that houses the make-break connector (see FIG. 7) and other components.

The cover 524 is connected by fasteners 614 to side walls 616, 618, 620, 622, and a top surface 624 of the enclosure 520. In some examples, the cover 524 includes an aisle-facing vertical surface 626 and a top surface 630 that extends inwardly at an angle such as 90° relative to the aisle-facing surface 626. The top surface 630 includes an opening 634 to allow fluid conduits 638 and connectors 640 to pass there through. A flexible sealing material 641 is arranged between the top surface 630 and a top surface of side walls 616 to form a seal around the fluid conduits 638. In some examples, the flexible sealing material 641 includes foam material with holes and/or slits extending from the holes to one edge of the flexible sealing material 641 to allow the fluid conduits 638 to be installed.

The horizontal housing portion 612 includes a cover 650, side walls 652, a bottom surface 654. Openings 656 in the side walls 652 and a flexible sealing material 658 (such as foam with the holes and slits as described above) can be used to provide a flexible seal for connectors 660, which can include fluid and/or electrical connectors.

Figure 7:
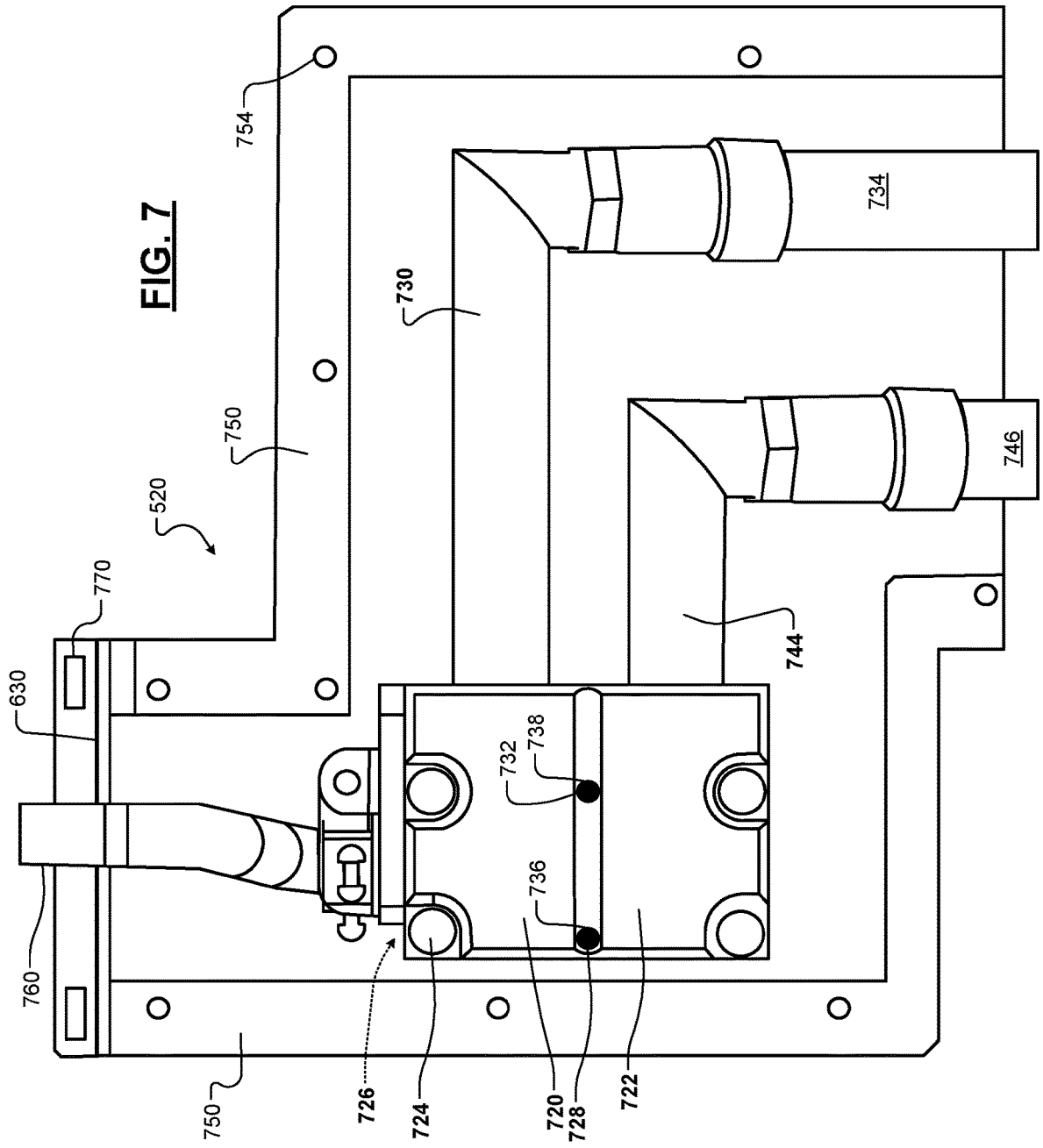
FIG. 7 is a perspective view of an example of the enclosure with a cover removed in accordance with the present disclosure.

Referring now to FIG. 7, the enclosure 520 is shown with the cover 524 (see FIG. 6) removed. A make-break connector 720 is located within the enclosure 520 and includes a first portion 722 connected by one or more fasteners 724 to a second portion 726. In some examples, the fasteners 724 include threaded bolts. As shown and described below with reference to FIGS. 11-13, the second portion 726 includes two (or more) alignment pins 728, 732 that pass through corresponding bores 736, 738 in the first portion 722 and facilitate installing the first portion 722 onto the second portion 726.

The first portion 722 lies adjacent to the aisle and the second portion 726 is arranged inwardly towards the substrate transfer module relative to the first portion 722. Ends of conduits 730 and 744 are connected to the first portion 722. Ends of conduits 734 and 746 are connected to opposite ends of the conduits 730 and 744. In some examples, the conduits 730 and 744 are hard lines and the conduits 734 and 746 are flexible lines. For example only, the conduits 730 and 744 are respectively joined to the conduits 734 and 746 by miter joints as shown. Instead, the conduits 730 and 734 may be joined by a tubing with a rounded bend. Additionally, if the height of the enclosure 520 allows, the conduits 744 and 746 may also be joined by a tubing with a rounded bend.

A conduit 760 is connected to the second portion 726. In some examples, the conduit 760 includes a hard line and/or a flexible line. The enclosure 520 includes a flange 750 extending inwardly from sides thereof. The flange 750 includes bores to receive fasteners to attach the cover 524 to the enclosure 520. Tabs 770 on an upper edge of the enclosure 520 can be used to secure and interlock with projections on an upper and inner end of the cover 524 when the cover 524 is attached.

Figure 9:
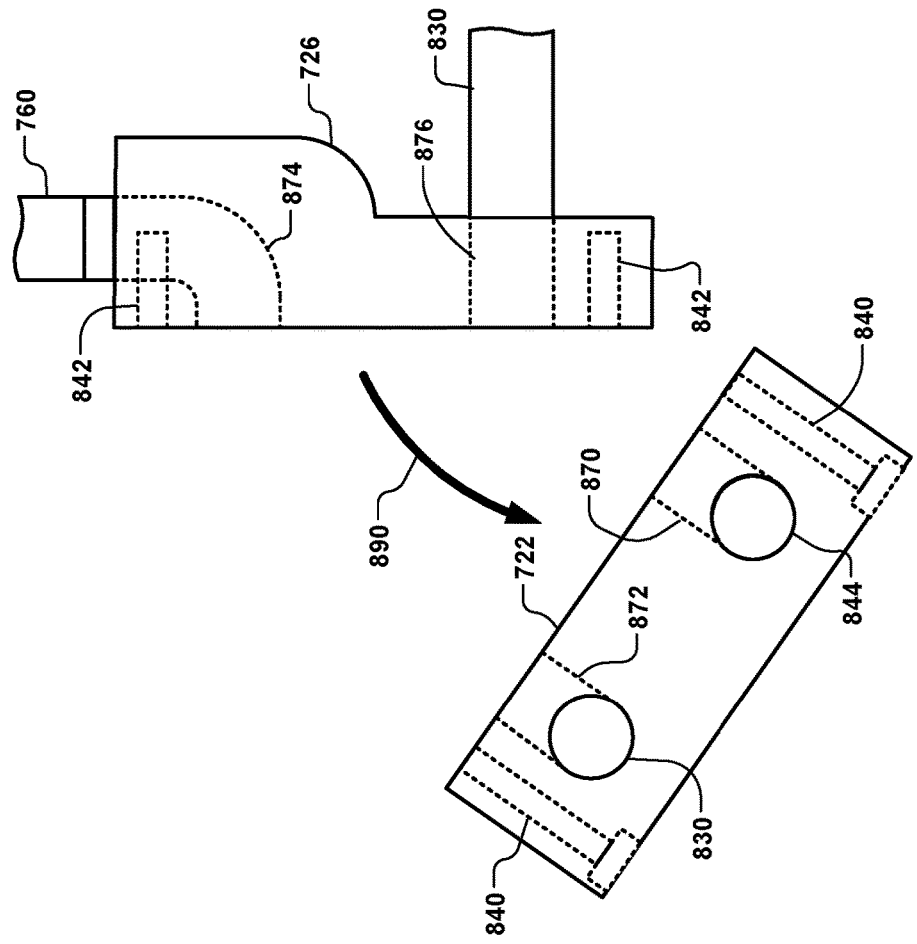
FIGS. 8 and 9 are side views of an example of the make-break connector in connected and disconnected positions, respectively in accordance with the present disclosure.
Figure 8:
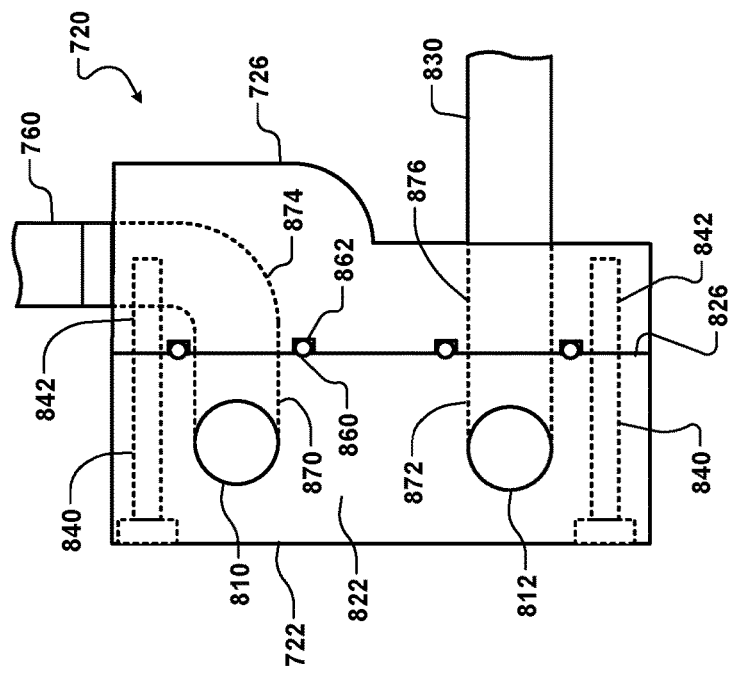
Figure 10:
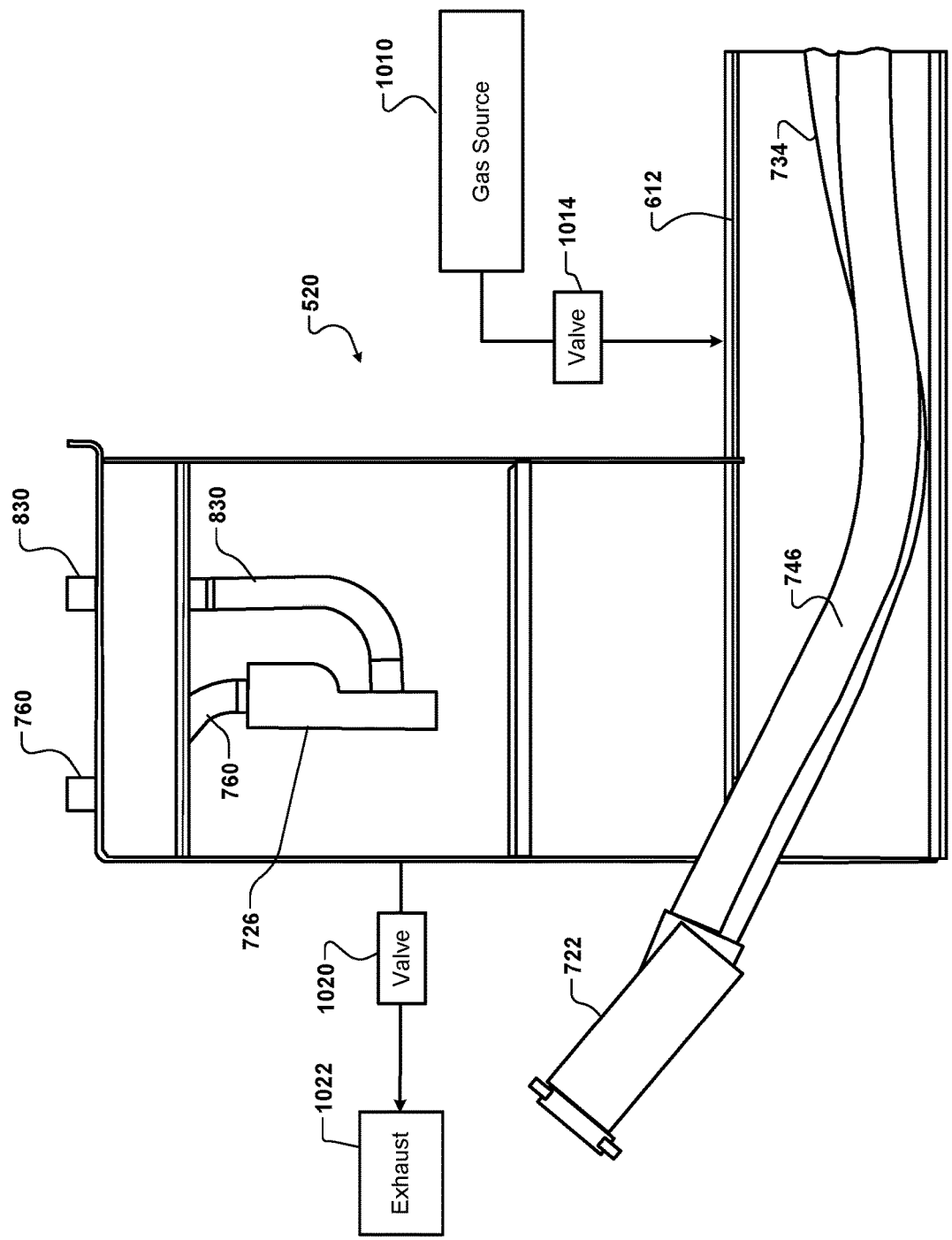
FIG. 10 is a cross-sectional side view of an example of the make-break connector in the disconnected position in accordance with the present disclosure.

Referring now to FIGS. 8 to 10, the make-break connector 720 is shown in a connected position (see FIG. 8) and a disconnected position (see FIGS. 9 and 10). The alignment pins 728, 732 and bores 736, 738 are omitted in these figures to illustrate other features of the make-break connector 720. The first portion 722 includes openings fluidly connected to flow passages 810 and 812 on a side 822 thereof. The flow passages 810 and 812 align with the ends of the conduits 730 and 744 (see FIG. 7). The flow passages 810 and 812 extend into the first portion 722 and then turn 90° (see flow passages 870 and 872, respectively) towards a side 826 of the first portion 722 abutting the second portion 726. Flow passages 874 and 876 in the second portion 726 fluidly communicate with the flow passages 870 and 872. Seals (such as O-rings 860 arranged in grooves 862) may be arranged on an abutting surface between the first portion 722 and the second portion 726 around fluid connections between the flow passages 870 and 872 and the flow passages 874 and 876. The flow passage 874 turns 90° in an upward direction and exits a top surface of the second portion 726. An end of the flow passage 874 is connected to the conduit 760. The flow passage 876 extends in a horizontal direction through a rear wall of the second portion 726 and includes an end that fluidly communicates with the conduit 830.

Bores 840 in the first portion 722 and threaded bores 842 in the second portion 726 receive threaded fasteners to connect the first portion 722 and the second portion 726 together. When the slide and pivot assembly needs to be moved from the closed position to a service position, the first portion 722 and the second portion 726 of the make-break connector are detached and the first portion 722 is pulled forward and downward as shown in FIG. 9. As can be appreciated, the conduit 734 and the conduit 746 are flexible to allow bending.

In other words, the fasteners 724 (see FIG. 7) are removed and the first portion 722 is pulled in an outward and downward direction indicated by arrow 890 towards the aisle. The second portion 726, which is located behind the first portion 722, stays with the slide and pivot assembly and moves in a direction indicated by arrow 892.

In some examples, the enclosure 520 can be purged by a gas source 1010 connected by conduit and an optional valve 1014 to the enclosure 520 as shown in FIG. 10. The enclosure 520 may be connected by conduit and an optional valve 1020 to an exhaust system 1022. In some examples, the gas source supplies an inert gas such as molecular nitrogen (N$_2$). In other examples, clean dry air (CDA) is used. The use of a purged enclosure reduces condensation in the enclosure 520.

Figure 11:
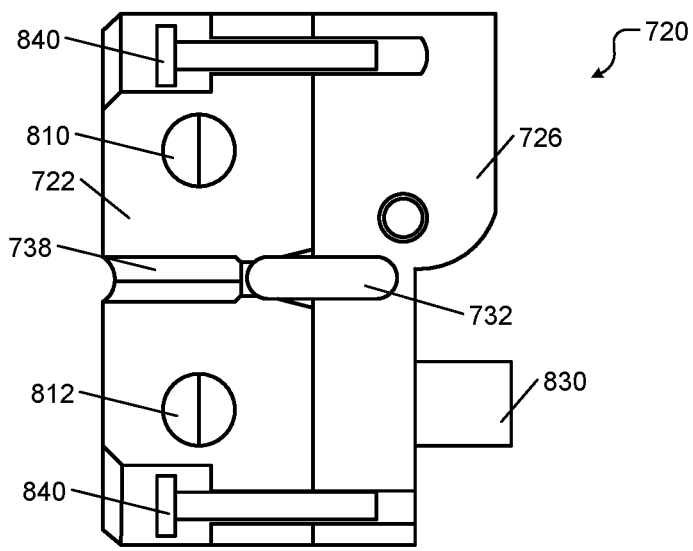
FIGS. 11-13 show various views of alignment pins of the make-break connector.
Figure 12:
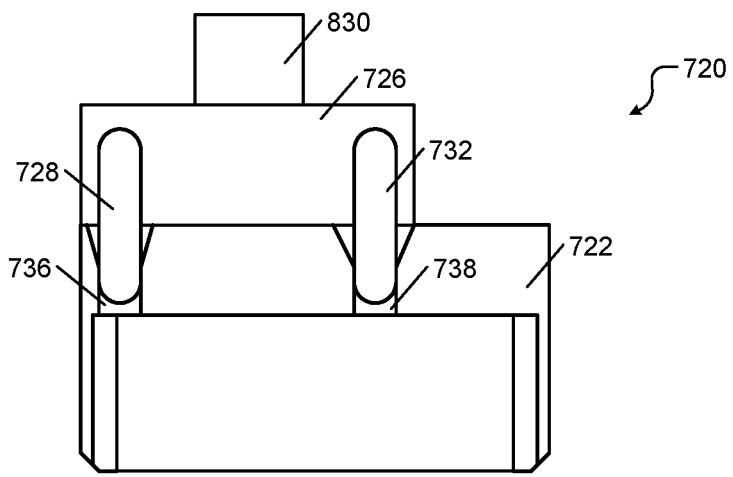
Figure 13:
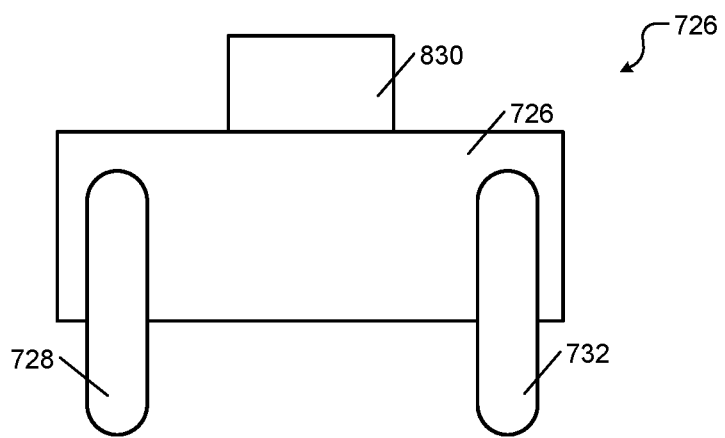

FIGS. 11-13 show various views of the alignment pins 728, 732 of the make-break connector 720. FIG. 11 shows a cross-sectional view of the make-break connector 720. In this view, only the alignment pin 732 in the second portion 726 of the make-break connector 720 and the corresponding bore 738 in the first portion 722 of the make-break connector 720 are visible. In this view, the first and second portions 720, 726 of the make-break connector 720 are shown mated. Therefore, the alignment pins 728, 732 of the second portion 726 are shown inserted into (i.e., mated with) the corresponding bores 736, 738 in the first portion 722. When installing the first portion 720 onto the second portion 726, the alignment pins 728, 732 guide the installation and facilitate the insertion and fastening of the fasteners into respective bores 840.

FIG. 12 shows a top view of the make-break connector 720. In this view, both the alignment pins 728, 732 of the second portion 726 and the corresponding bores 736, 738 in the first portion 722 are visible. In this view, the first and second portions 720, 726 are again shown mated. Therefore, the alignment pins 728, 732 of the second portion 726 are shown inserted into (i.e., mated with) the corresponding bores 736, 738 in the first portion 722.

FIG. 13 shows a top view of the second portion 726 with the alignment pins 728, 732 visible. Note that the alignment pins 728, 732 and the corresponding bores 736, 738 are shown to be round in shape for example only. Alternatively, the alignment pins 728, 732 and the corresponding bores 736, 738 can be of any other shape (e.g., square, hexagonal, etc.).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A substrate processing system comprising:
a hinge assembly configured to allow a substrate support and an RF bias assembly of a processing chamber to slide, from a docked position to an undocked position, relative to other components of the processing chamber; and
a make-break connector configured to supply fluid to at least one of the substrate support and the RF bias assembly and including:
a first portion including a first fluid passage connected to a first conduit;
a second portion including a second fluid passage connected to a second conduit,
wherein the first fluid passage in the first portion fluidly communicates with the second fluid passage in the second portion; and
a fastener removably connecting the first portion to the second portion, wherein the first portion is configured to slide with the substrate support and the RF bias assembly relative to the second portion and the other portions of the processing chamber, and wherein the first portion is located inwardly from the second portion relative to a direction of sliding from the docked position to the undocked position.

2. The substrate processing system of claim 1, wherein the first portion is connected to the second portion when the make-break connector is in the docked position.

3. The substrate processing system of claim 1, wherein the first portion is disconnected from the second portion when the make-break connector is in the undocked position.

4. The substrate processing system of claim 1, wherein the hinge assembly is configured to allow the substrate support and the RF bias assembly to slide from the docked position to the undocked position and then pivot to a predetermined angle greater than 90°.

5. The substrate processing system of claim 1, further comprising an enclosure, wherein the make-break connector is arranged inside the enclosure.

6. The substrate processing system of claim 5, wherein the enclosure is connected to a gas source and is purged during operation.

7. The substrate processing system of claim 6, wherein the gas source is purged with molecular nitrogen.

8. The substrate processing system of claim 6, wherein the gas source is purged with clean dry air.

9. The substrate processing system of claim 1, wherein:
the first portion includes a third fluid passage connected to a third conduit;
the second portion includes a fourth fluid passage connected to a fourth conduit; and
the third fluid passage in the first portion fluidly communicates with the fourth fluid passage in the second portion.

10. A tool comprising:
an equipment front end module (EFEM);
a substrate transfer module;
a load lock arranged between the EFEM and the substrate transfer module; and
2N substrate processing systems of claim 1, where N is an integer from 1 to 5, wherein half of the 2N substrate processing systems are arranged on one side of the substrate transfer module and the other half of the 2N substrate processing systems are arranged on an opposite side of the substrate transfer module.

11. The substrate processing system of claim 1, wherein:
the first portion of the make-break connector includes a plurality of bores; and
the second portion of the make-break connector includes a plurality of alignment pins that mate with the plurality of bores, respectively, when the first portion is connected to the second portion.

* * * * *